United States Patent
Jeon et al.

(10) Patent No.: US 7,390,719 B2
(45) Date of Patent: Jun. 24, 2008

(54) METHOD OF MANUFACTURING A SEMICONDUCTOR DEVICE HAVING A DUAL GATE STRUCTURE

(75) Inventors: Taek-Soo Jeon, Yongin-si (KR); Yu-Gyun Shin, Seongnam-si (KR); Sang-Bom Kang, Seoul (KR); Hag-Ju Cho, Seoul (KR); Hye-Lan Lee, Hwaseong-si (KR); Sang-Yong Kim, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 112 days.

(21) Appl. No.: 11/497,972

(22) Filed: Aug. 1, 2006

(65) Prior Publication Data

US 2007/0082415 A1 Apr. 12, 2007

(30) Foreign Application Priority Data

Aug. 2, 2005 (KR) ............. 10-2005-0070499

(51) Int. Cl.
*H01L 21/8234* (2006.01)
(52) U.S. Cl. ............. 438/275; 438/199; 438/200; 438/216; 438/217; 438/218; 438/231; 438/232; 438/233; 257/E21.637
(58) Field of Classification Search ............ 438/216, 438/218, 231, 232, 233, 528
See application file for complete search history.

(56) References Cited

U.S. PATENT DOCUMENTS

| | | | |
|---|---|---|---|
| 6,727,130 B2 | 4/2004 | Kim et al. | |
| 6,815,285 B2 | 11/2004 | Choi et al. | |
| 2003/0180994 A1* | 9/2003 | Polishchuk et al. | 438/199 |
| 2005/0026345 A1 | 2/2005 | Adetutu et al. | 438/199 |

FOREIGN PATENT DOCUMENTS

| | | |
|---|---|---|
| JP | 2002359295 | 12/2002 |
| KR | 10-476926 | 3/2005 |

\* cited by examiner

*Primary Examiner*—Michael S. Lebentritt
*Assistant Examiner*—Kyoung Lee
(74) *Attorney, Agent, or Firm*—Mills & Onello LLP

(57) ABSTRACT

A semiconductor device having a dual gate is formed on a substrate having a dielectric layer. A first metallic conductive layer is formed on the dielectric layer to a first thickness, and annealed to have a reduced etching rate. A second metallic conductive layer is formed on the first metallic conductive layer to a second thickness that is greater than the first thickness. A portion of the second metallic conductive layer formed in a second area of the substrate is removed using an etching selectivity. A first gate structure having a first metallic gate including the first and the second metallic conductive layers is formed in a first area of the substrate. A second gate structure having a second metallic gate is formed in the second area. A gate dielectric layer is not exposed to an etching chemical due to the first metallic conductive layer, so its dielectric characteristics are not degraded.

20 Claims, 6 Drawing Sheets

METHOD OF MANUFACTURING A SEMICONDUCTOR DEVICE HAVING A DUAL GATE STRUCTURE

CROSS-REFERENCE TO RELATED APPLICATIONS

This application claims priority under 35 USC § 119 to Korean Patent Application No. 10-2005-0070499 filed on Aug. 2, 2005 in the Korean Intellectual Property Office, the contents of which are herein incorporated by reference in their entireties.

BACKGROUND OF THE INVENTION

1. Field of the Invention

Example embodiments of the present invention relate to a method of manufacturing a semiconductor device. More particularly, example embodiment of the present invention relate to a method of manufacturing a complementary metal-oxide semiconductor (CMOS) device having a dual gate structure.

2. Description of the Related Art

A metal-oxide semiconductor (MOS) transistor is classified as either an N-type MOS (NMOS) transistor or a P-type MOS (PMOS) transistor according to a kind of a channel. When both the NMOS transistor and the PMOS transistor are formed in a semiconductor substrate to form a transistor, the transistor is called a complementary MOS (CMOS).

Up to now, polysilicon has been typically used as a gate electrode of a CMOS transistor, and the polysilicon gate electrode of the CMOS is commonly doped with P-type impurities or N-type impurities in accordance with an electrical polarity of impurities doped into source/drain regions of the substrate. As a semiconductor device becomes more highly integrated, however, there are many problems that arise in using polysilicon as the gate electrode of the CMOS transistor.

A polysilicon gate needs to be heavily doped with impurities in order to have conductivity similar to that of metal, and dopant solubility in the polysilicon gate is limited to about $5 \times 10^{20}$ atoms/cm$^3$. Because the dopant solubility restricts a number of electron carriers in the polysilicon gate, when a voltage is applied to the gate electrode a depletion layer is formed at an interface between the polysilicon gate and a gate dielectric layer formed below the polysilicon gate. The depletion layer in the polysilicon gate increases an equivalent oxide thickness (EOT) of a transistor by at least about 4 to about 5 Å so that the depletion layer acts as a factor in reducing a driving current of the transistor.

A silicon oxide layer or a silicon oxynitride layer has been mainly used as the gate dielectric layer, which has physical limitations in improving electrical characteristics as a thickness of the gate dielectric layer is reduced. That is, reliability of the gate dielectric layer is reduced as the gate dielectric layer becomes thinner and thinner. For example, when the thickness of a silicon oxide gate dielectric layer is reduced to no more than about 20 Å, a leakage current at a gate electrode increases by a direct tunneling, and power consumption also increases. Thus, there are limitations in reducing the thickness of the gate dielectric layer when the gate dielectric layer includes silicon oxide or silicon oxynitride.

In order to overcome the above-mentioned problems, research has been recently conducted on a gate dielectric layer including a material having a high dielectric constant (i.e., a "high-k" gate dielectric layer) in place of the silicon oxide or silicon oxynitride, because the high-k gate dielectric layer can be formed to a relatively small EOT and can sufficiently reduce the leakage current between the gate electrode and a channel region.

However, when the gate dielectric layer includes a high-k material and the gate electrode includes polysilicon in a MOS transistor, problems can result. For instance, defect states and a plurality of bulk traps at an interface between the semiconductor substrate and the gate dielectric layer capture conducting electrons so that a Fermi level is pinned at a charge neutrality level or at a central portion of an energy band positioned near the charge neutrality level. Hence, a problem occurs in that a threshold voltage (Vth) greatly increases.

A depletion effect and a pinning phenomenon of the Fermi level of the polysilicon gate electrode occur more seriously in the PMOS transistor. Particularly, in a case of the PMOS transistor, dopants, i.e., boron (B), penetrate a gate insulation layer and permeate a channel region of the semiconductor substrate to change a flat-band voltage (Vfb) and the threshold voltage (Vth), and degenerate reliability of elements.

For the above reasons, there is a strong tendency for polysilicon to be substituted with a metallic material for a gate electrode. The metallic material has an extremely large number of carriers (about $5 \times 10^{22}$ atoms/cm$^3$) so that a thickness of the depletion region becomes substantially zero. Thus, when the gate electrode includes metal in place of polysilicon, the depletion effect and the pinning phenomenon of the Fermi level can be sufficiently prevented. However, the metallic material has a disadvantage of thermal instability as compared to polysilicon, and the processing steps for forming the metallic gate electrode is incompatible with existing processing steps for forming the polysilicon gate electrode.

Thus, a metal/polysilicon gate stack structure in which a metallic gate is interposed between the gate dielectric layer and the polysilicon gate are proposed. According to the metal/polysilicon gate stack structure, the depletion effect of polysilicon can be removed and the pinning phenomenon of the Fermi level can be prevented, while compatibility with the existing process is still maintained.

A work function of the metallic gate determines a doping level of the semiconductor substrate and the threshold voltage of the MOS transistor. Thus, in a CMOS transistor, where both the NMOS transistor and the PMOS transistor require a low threshold voltage of about 0.3 to about 0.6 V, a material included in the metallic gate requires a work function of about 4.0 to about 4.4 eV in the NMOS transistor, and a work function of about 4.8 to about 5.2 eV in the PMOS transistor.

FIGS. 1A and 1B are cross-sectional views illustrating a method of manufacturing a semiconductor device having a dual gate structure according to one conventional method.

Referring to FIG. 1A, a gate dielectric layer 12 is formed on a semiconductor substrate 10 having a PMOS transistor area and an NMOS transistor area. After forming a first metal layer 14 on the gate dielectric layer 12, the first metal layer 14 formed in the NMOS transistor area is selectively removed so that only the first metal layer 14 formed in the PMOS transistor area remains.

Referring to FIG. 1B, a second metal layer 16 is formed on the first metal layer 14 and the gate dielectric layer 12. Thus, a first metal gate including the first metal layer 14 and the second metal layer 16 is formed on the PMOS transistor area, and a second metal gate including the second metal layer 16 is formed in the NMOS transistor area.

According to the above-mentioned conventional method, a work function of a gate electrode of the PMOS transistor primarily depends upon the first metal layer 14, and a work function of a gate electrode of the NMOS transistor primarily depends upon the second metal layer 16. Thus, a dual gate electrode having a work function required for each of the PMOS transistor and the NMOS transistor can be formed.

However, according to the above-mentioned conventional method, when the first metal layer 14 in the NMOS transistor area is removed, the gate dielectric layer 12 is exposed to an etching chemical, so that the gate dielectric layer may be damaged by etching. Thus, dielectric characteristics of the gate dielectric layer 12 are degraded.

FIG. 2 is a cross-sectional view illustrating a method of manufacturing a semiconductor device having a dual gate structure according to another conventional method.

Referring to FIG. 2, after forming a gate dielectric layer 52 on a semiconductor substrate 50 having a PMOS transistor area and an NMOS transistor area, a metal layer 54 is thickly formed on the gate dielectric layer 52. Sequentially, the metal layer 54 formed in the NMOS transistor area is etched with a predetermined thickness by a timed etching process so that a thin metal layer 54a with a desired thickness remains in the NMOS transistor area.

According to the above conventional method, a work function of a gate electrode of the PMOS transistor primarily depends upon the thick metal layer 54, and a work function of a gate electrode of the NMOS transistor primarily depends upon a material formed on the thin metal layer 54a.

However, according to the above conventional method, the metal layer 54 is etched by a timed etching process, with which controlling uniformity of the thickness of the thin metal layer 54a is difficult. Thus, uniformity of the work function of the gate electrode of the NMOS transistor cannot be ensured.

SUMMARY OF THE INVENTION

Provided is a method of manufacturing a semiconductor device having a dual gate structure, capable of ensuring a work function optimized for an N-type metal-oxide semiconductor (NMOS) transistor area and a P-type metal-oxide semiconductor (PMOS) transistor area.

According to one aspect of the present disclosure, there is provided a method of manufacturing a semiconductor device having a dual gate structure. The method includes providing a semiconductor substrate having a first area and a second area. A dielectric layer is formed on the semiconductor substrate. A first metallic conductive layer is formed on the dielectric layer to a first thickness. The first metallic conductive layer is annealed to reduce an etching rate of the first metallic conductive layer. A second metallic conductive layer is formed on the annealed first metallic conductive layer to a second thickness greater than the first thickness, so that the second metallic conductive layer has an etching selectivity relative to the annealed first metallic conductive layer. As a function of the etching selectivity, the second metallic conductive layer is etched from the annealed first metallic conductive layer in the second area of the substrate, while the second metallic conductive layer is maintained on the annealed first metallic conductive layer in the first area of the substrate. A first gate structure is formed to include a first metallic gate formed on the first area of the substrate, wherein the first metallic gate includes the annealed first metallic conductive layer and the second metallic conductive layer. And a second gate structure is formed to include a second metallic gate formed on the second area of the substrate, wherein the second metallic gate includes the annealed first metallic conductive layer.

The first metallic conductive layer can be thinly formed to a thickness wherein a work function of each of the first and second gate structures is primarily dependant upon a material formed on the first metallic conductive layer.

The first thickness can be in a range from about 10 Å to about 50 Å.

The first metallic conductive layer can be annealed at a temperature of not less than about 550° C.

The first metallic conductive layer can be annealed by a rapid thermal process (RTP).

The second metallic conductive layer can include a metallic material of having a work function suitable for forming a MOS transistor in the first area of the substrate.

The second thickness can be in a range from about 50 Å to about 150 Å.

The first and the second metallic conductive layers may include substantially the same material.

The first metallic conductive layer and the second metallic conductive layer can each comprise tantalum nitride (TaN), respectively.

The first metallic conductive layer and the second metallic conductive layer can be formed from different materials.

The method can further comprise increasing an etching rate and the etching selectivity of the second metallic conductive layer by performing a plasma treatment on the second metallic conductive layer prior to etching the second metallic conductive layer.

The plasma treatment can be performed in a nitrogen atmosphere.

According to another aspect of the present disclosure, there is provided a method of manufacturing a semiconductor device having a dual gate structure. The method includes providing a semiconductor substrate having a first area and a second area. A dielectric layer is formed on the semiconductor substrate. A first metallic conductive layer is formed on the dielectric layer to a first thickness. The first metallic conductive layer is annealed to reduce an etching rate of the first metallic conductive layer. A second metallic conductive layer is formed on the annealed first metallic conductive layer to a second thickness greater than the first thickness, so that the second metallic conductive layer has an etching selectivity relative to the annealed first metallic conductive layer. As a function of the etching selectivity, the second metallic conductive layer is etched from the annealed first metallic conductive layer in the second area of the substrate, while the second metallic conductive layer is maintained on the annealed first metallic conductive layer in the first area of the substrate. A polysilicon layer is formed on the second metallic conductive layer in the first area of the substrate and on the annealed first metallic conductive layer in the second area of the substrate. A first gate structure is formed in the first area and a second gate structure is formed in the second area by partially etching the polysilicon layer, the second metallic conductive layer and the annealed first metallic conductive layer. The first gate structure includes a first metallic gate and a first polysilicon gate, wherein the first metallic gate has a first metallic conductive pattern formed from the first metallic conductive layer and a second metallic conductive pattern formed from the second metallic conductive layer. And the second gate structure includes a second metallic gate and a second polysilicon gate, wherein the second metallic gate is formed from the first metallic conductive layer.

The first metallic conductive layer can be thinly formed to a thickness wherein a work function of each of the first and second gate structures is primarily dependant upon a material formed on the first metallic conductive layer.

The first metallic conductive layer can be annealed by a rapid thermal process (RTP).

The second metallic conductive layer can include a metallic material of which a work function is suitable for a MOS transistor in the first area of the substrate.

The first and the second metallic conductive layers can include substantially the same material.

The first metallic conductive layer and the second metallic conductive layer can be comprised of different materials.

The second metallic conductive layer can be etched using a mask layer. The mask layer can be partially etched such that the mask layer is removed from the second metallic conductive layer in the second area of the substrate, while the mask layer is maintained on the second metallic conductive layer in the first area of the substrate, thereby forming a mask pattern through which the second metallic conductive layer in the second area of the substrate is exposed. The second metallic conductive layer in the second area of the substrate can be removed using the mask layer pattern as an etching mask, while maintaining the second metallic conductive layer in the first area of the substrate. The mask layer pattern can be removed from the second metallic conductive layer remaining in the first area of the substrate.

The etching rate and the etching selectivity of the second metallic conductive layer can be increased by performing a plasma treatment on the second metallic conductive layer prior to etching the second metallic conductive layer.

According to various aspects the present invention, the first metallic conductive layer can be thinly formed on the gate dielectric layer, and the first metallic conductive layer can be annealed to have a reduced etching rate. Then, the second metallic conductive layer can be thickly formed on the first metallic conductive layer, and the second metallic conductive layer can be formed in another area. For example, the second area can be selectively removed so that only a portion of the second metallic conductive layer formed in the first area remains. Thus, the first metallic gate, including the first metallic conductive layer and the second metallic conductive layer, is formed in the first area, and the second metallic gate, including the first metallic conductive layer, is formed in the second area.

In accordance with various aspects of the disclosure, in the etching process of the second metallic conductive layer, because the etching rate of the first metallic conductive layer can be reduced, the second metallic conductive layer can have a high etching selectivity with respect to the first metallic conductive layer, so that the etching process may be terminated without etching the first metallic conductive layer.

As a result, the gate dielectric layer is not exposed to an etching chemical due to the first metallic conductive layer, so that degradation of dielectric characteristics of the gate dielectric layer may be prevented, and the thicknesses of the first metallic gate and the second metallic gate may be uniformly controlled in the first area and the second area, respectively.

Thus, by using a work function difference related to the thickness of the metallic gate formed between the gate dielectric layer and the polysilicon gate, a gate electrode having an optimized work function for the NMOS transistor and the PMOS transistor, respectively, may be formed.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Figure 1A:
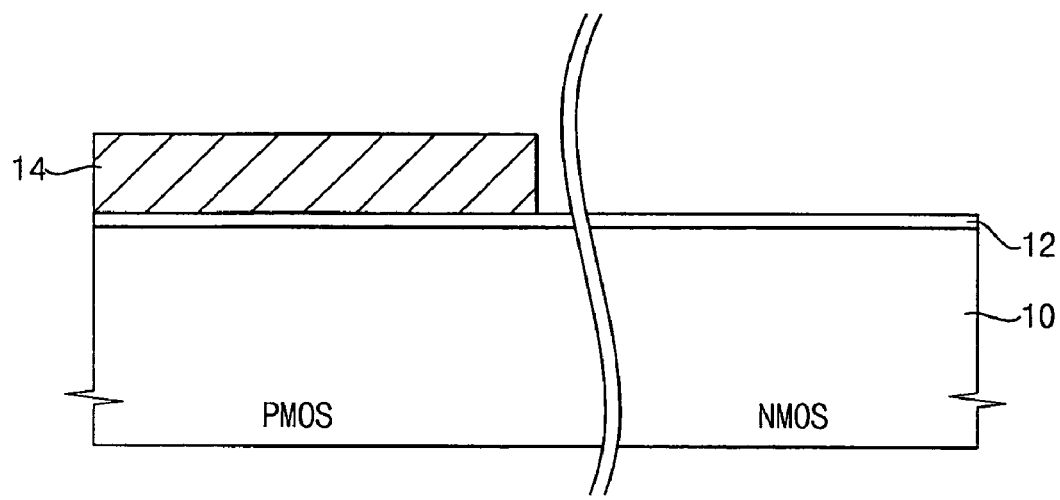
FIGS. 1A and 1B are cross-sectional views illustrating a conventional method of manufacturing a semiconductor device having a dual gate structure.
Figure 1B:
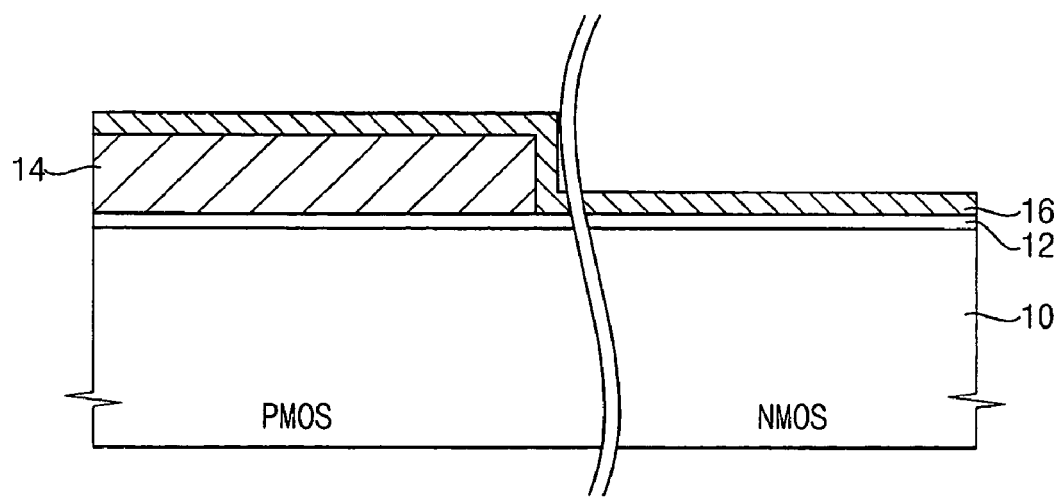
Figure 2:
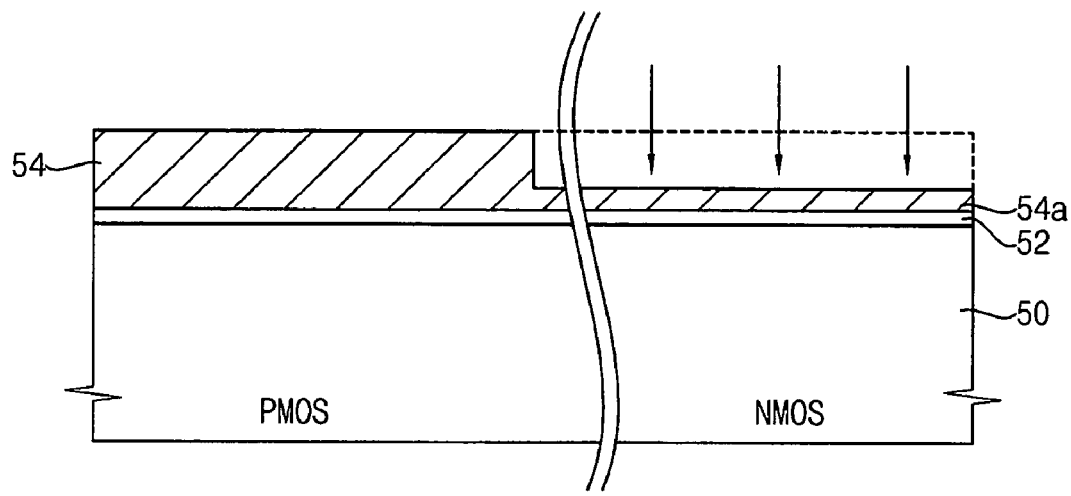
FIG. 2 is a cross-sectional view illustrating another conventional method of manufacturing a semiconductor device having a dual gate structure.

The accompanying drawings are described herein below, in which example embodiments in accordance with the present invention are shown. The present invention may, however, be embodied in many different forms and should not be construed as limited to the example embodiments set forth herein.

In the drawings, the sizes and relative sizes of layers and regions may be exaggerated for clarity. It will also be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," and/or "including" when used in this specification or the claims specify the presence of stated features, integers, steps, operations, elements, and/or components, but do not preclude the presence or addition of one or more other features, integers, steps, operations, elements, components, and/or groups thereof.

With respect to the example embodiments described herein, variations from the shapes of the illustrations as a result of, for example, manufacturing techniques and/or tolerances, are to be expected. Thus, the example embodiments should not be construed as limited to the particular shapes or relative sizes of regions illustrated herein, but are to include deviations in shapes or relative sizes that result, for example, from manufacturing processes or typically acceptable tolerance ranges. For example, an implanted region illustrated as a rectangle will, typically, have rounded or curved features and/or a gradient of implant concentration at its edges, rather than a binary (or absolute) change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 3:
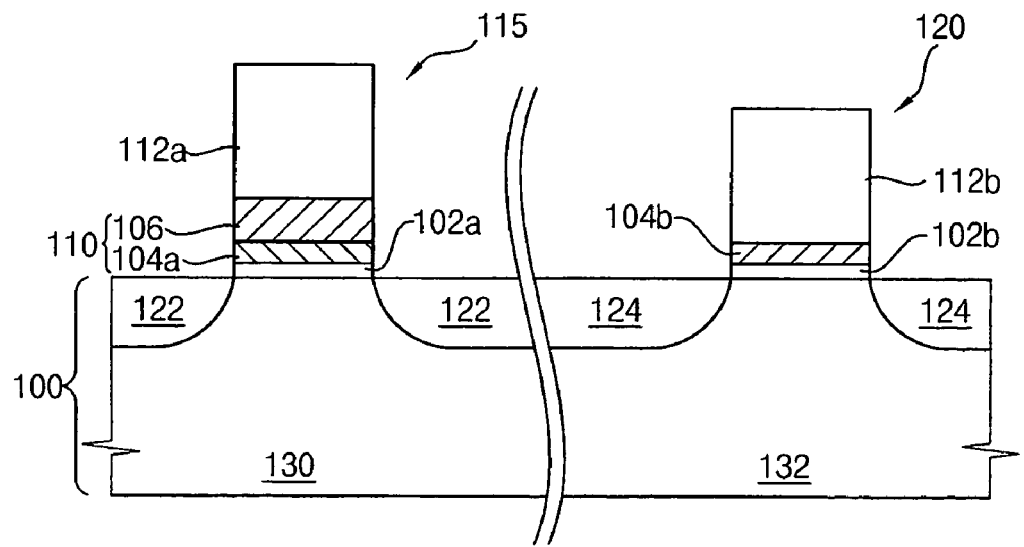
FIG. 3 is a cross-sectional view illustrating an example embodiment of a semiconductor device having a dual gate structure in accordance with aspects of the present invention.

FIG. 3 is a cross-sectional view illustrating an example embodiment of a semiconductor device having a dual gate structure. The semiconductor device includes a semiconductor substrate 100 having a first area 130 in which a first conductive metal-oxide semiconductor (MOS) transistor is formed, and a second area 132 in which a second conductive MOS transistor is formed. The first and the second conductive MOS transistors have opposite conduction types.

The first conductive MOS transistor includes a first gate dielectric layer 102a, a first gate structure 115 and first source/drain regions 122 formed in the first area 130 of the semiconductor substrate 100. The second conductive MOS transistor includes a second gate dielectric layer 102b, a second gate structure 120 and second source/drain regions 124 formed in the second area 132 of the semiconductor substrate 100.

The first gate structure 115 of the first conductive MOS transistor includes a first metallic gate 110 and a first polysilicon gate 112a sequentially formed on the first gate dielectric layer 102a. The first metallic gate 110 has a lower metallic conductive pattern 104a formed from a first metallic conductive layer (not shown) and an upper metallic conductive pattern 106 formed from a second metallic conductive layer (not shown).

The second gate structure 120 of the second conductive MOS transistor includes a second metallic gate 104b and a second polysilicon gate 112b sequentially formed on the second dielectric layer 102b.

A silicon conduction band is set at an energy level of about 4.1 eV below a vacuum level, and silicon valence band is set at an energy level of about 1.1 eV below the silicon conduction band or about 5.2 eV below the vacuum level. An energy gap between the silicon conduction band and the silicon valence band is called a "silicon band gap." A silicon central gap is set near a halfway point of the silicon band gap, that is, the silicon central gap is set near a halfway point between the silicon conduction band and the silicon valence band.

A work function for a gate electrode of an N-type MOS (NMOS) transistor preferably has an energy level between a conduction band and a central gap of a corresponding semiconductor substrate. For example, when a silicon semiconductor substrate is used as the semiconductor substrate 100, the work function for the gate electrode of the NMOS transistor preferably has an energy level between the silicon conduction band and the silicon central gap of the silicon semiconductor substrate, and more preferably has an energy level of about 4.0 to about 4.4 eV below the vacuum level. On the other hand, a work function for a gate electrode of a P-type MOS (PMOS) transistor preferably has an energy level between the central gap and a valence band of the semiconductor substrate. For example, when the silicon semiconductor substrate is used as the semiconductor substrate, the work function for the gate electrode of the PMOS transistor preferably has an energy level between the silicon central gap and the silicon valence band of the silicon semiconductor substrate, and more preferably has an energy level of about 4.8 to about 5.2 eV below the vacuum level.

When the MOS transistor has a gate structure having a metallic gate and a polysilicon gate sequentially stacked on the gate dielectric layer 102a, a flat-band voltage of the MOS transistor varies according to a thickness of the metallic gate that may include metal or a metal compound. In the above gate structure, the flat-band voltage becomes more dependent upon a work function of the polysilicon gate as the thickness of the metallic gate becomes smaller. In contrast, the flat-band voltage becomes more dependent upon a work function of the metallic gate as the metallic gate becomes thicker. Accordingly, the flat-band voltage for an NMOS transistor and a PMOS transistor in a CMOS device may be easily obtained by controlling the thickness of the metallic gate, thereby facilitating the manufacture of the CMOS device including NMOS and PMOS transistors, with relatively good uniformity.

Figure 4:
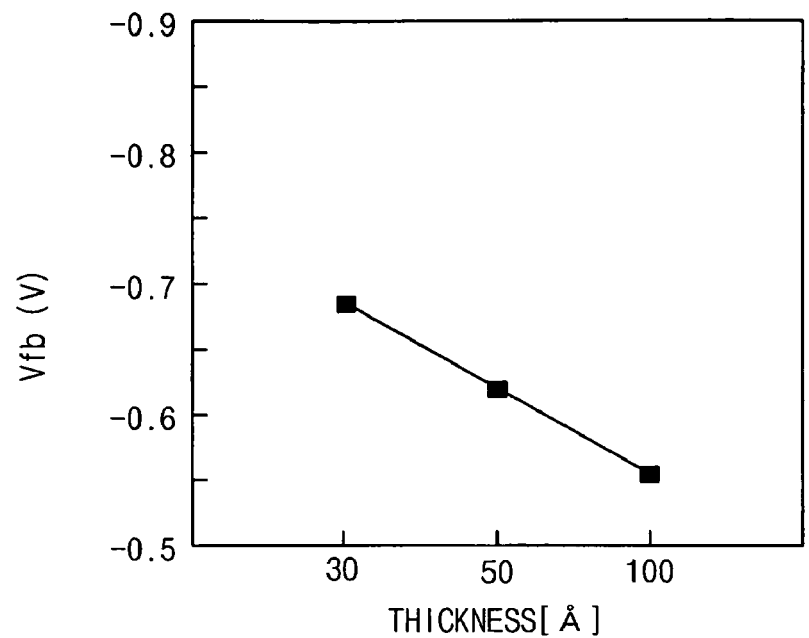
FIG. 4 is a graph showing a flat-band voltage (Vfb) variation in an N-type metal-oxide semiconductor (NMOS) transistor with respect to a thickness of a tantalum nitride layer in a gate structure including the tantalum nitride layer, and a polysilicon layer sequentially formed.

FIG. 4 is a graph showing a measured flat-band voltage (Vfb) variation with respect to a thickness of a tantalum nitride layer in a gate structure including the tantalum nitride layer and a polysilicon layer, such as the gate structures shown in the embodiment of FIG. 3. The flat-band voltage (Vfb) variation was measured using several sample NMOS transistors, with each sample NMOS transistor having a thickness corresponding to those shown in FIG. 4. More specifically, a gate dielectric layer including hafnium silicon oxynitride (HfSiON) was formed on a P-type silicon substrate (or P-type well). A tantalum nitride layer was formed on the gate dielectric layer, and a polysilicon layer doped with N-type impurities was formed on the tantalum nitride layer. Then, the polysilicon layer and the tantalum nitride layer were sequentially patterned by a photolithography process, to form a gate electrode of each NMOS transistor. Each of the NMOS transistors was formed with a tantalum nitride layer having a thickness different from those of the others. Then, the flat-band voltage (Vfb) was measured for each of the sample NMOS transistors, and the measured data was arranged in accordance with the thickness of the tantalum nitride layer in each of the sample NMOS transistors, as shown in FIG. 4.

As is shown by the data of FIG. 4, the flat-band voltage of the NMOS transistor is inversely proportional to the thickness of the tantalum nitride layer. The inverse proportionality shown in FIG. 4 indicates that a work function difference between the gate electrode and the P-type silicon substrate increases, as the thickness of the tantalum nitride layer increases.

The tantalum nitride layer has a work function of about 4.8 to about 4.9 eV, and the polysilicon layer doped with the N-type impurities has a work function of about 4.1 eV. Further, the P-type silicon substrate has a work function of about 5.2 eV. Thus, the increase of the work function difference between the gate electrode of the NMOS transistor and the P-type silicon substrate indicates that the work function of the gate electrode of the NMOS transistor primarily depends upon the work function of the polysilicon layer doped with the N-type impurities.

That is, as shown in the graph in FIG. 4, when the tantalum nitride layer is sufficiently thick, the work function of the gate electrode of the NMOS transistor primarily depends upon that of the tantalum nitride layer. However, when the thickness of the tantalum nitride layer is very small, the work function of the gate electrode of the NMOS transistor primarily depends upon that of the polysilicon layer formed on the tantalum nitride layer.

In one illustrative embodiment, the first gate structure 115 having the first metallic gate 110 and the first polysilicon gate 112a is formed in a PMOS transistor area 130, and the second gate structure 120 having the second metallic gate 104b and the second polysilicon gate 112b is formed in an NMOS transistor area 132. The first metallic gate 110 includes the lower metallic conductive pattern 104a formed from the first metallic conductive layer and the upper metallic conductive pattern 106 formed from the second metallic conductive layer. The second metallic gate 104b is also formed from the first metallic conductive layer.

In the example embodiment, the first metallic conductive layer is thinly formed to have a relatively small thickness, for example, a thickness of about 10 Å to about 50 Å. With a thin thickness, the work function of the first metallic gate 110 primarily depends upon that of a material formed on the first metallic conductive layer. Also, the second metallic conductive layer is formed using a metallic material having a work function of about 4.8 eV to about 5.2 eV. The first and the second polysilicon gates 112a and 112b can be formed using polysilicon doped with N-type impurities having a work function of about 4.1 eV.

With the above-described structures, a work function of the first gate structure 115 primarily depends upon that of the upper metallic conductive pattern 106 formed from the second metallic conductive layer, and a work function of the second gate structure 120 primarily depends upon that of the second polysilicon gate 112b, thereby forming a dual gate structure of which a work function is optimized for the PMOS transistor and the NMOS transistor, respectively.

In another illustrative embodiment of a dual gate structure, the first gate structure 115 having the first metallic gate 110 and the first polysilicon gate 112a is formed in the NMOS transistor area 130, and the second gate structure 120 having the second metallic gate 104b and the second polysilicon gate 112b is formed in the PMOS transistor area 132. The first metallic gate 110 includes the lower metallic conductive pattern 104a formed from the first metallic conductive layer and the upper metallic conductive pattern 106 formed from the second metallic conductive layer. The second metallic gate 104b is formed from the first metallic conductive layer.

The second metallic conductive layer determines a work function of the NMOS transistor and is formed using a metallic material having a work function of about 4.0 to about 4.4 eV. The first and the second polysilicon gates 112a and 112b are formed using polysilicon doped with P-type impurities having a work function of about 5.2 eV.

In the semiconductor device according to some example embodiments in accordance with the present invention, the first metallic conductive layer, from which the lower metallic conductive pattern 104a is formed, and the second metallic gate 104b protects the underlying gate dielectric layers 102a and 102b from damage caused by the etching processes used in forming the first and the second gate structures 115 and 120.

Additionally, the second metallic gate 104b of the second gate structure 120 functions as a diffusion barrier layer, so that dopants in the second polysilicon gate 112b formed on the second metallic gate 104b are prevented from diffusing into the second dielectric layer 102b due to the presence of the second metallic gate 104b. For example, when the second polysilicon gate 112b includes polysilicon doped with P-type impurities, the P-type impurities in the second polysilicon gate 112b, such as boron (B), are prevented from being diffused into the second dielectric layer 102b due to the presence of the second metallic gate 104b. As a result, the P-type impurities are sufficiently prevented from permeating into a channel region of the semiconductor substrate 100 via the second gate dielectric layer 102b.

FIGS. 5A to 5E are cross-sectional views of the semiconductor device shown in FIG. 3 illustrating a method of manufacturing the semiconductor device.

Figure 5A:
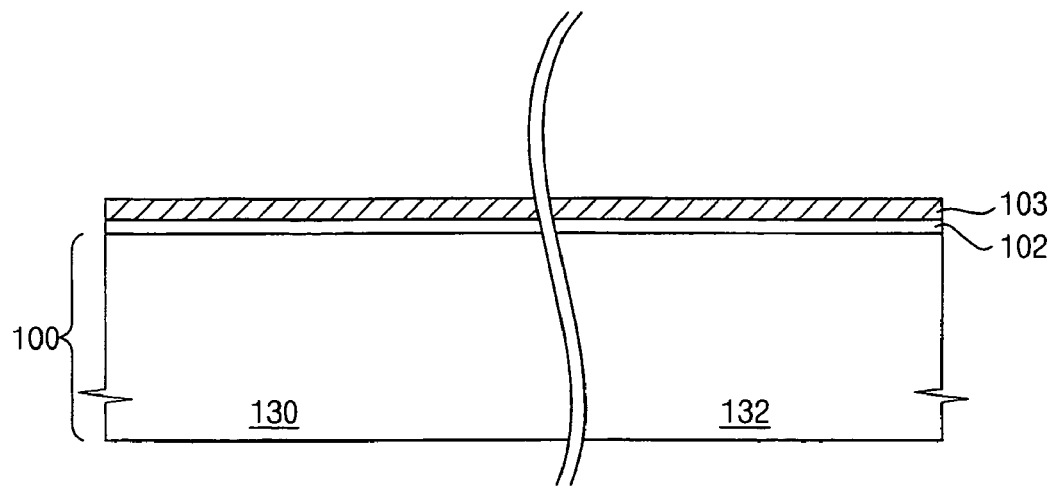
FIGS. 5A to 5E are cross-sectional views illustrating a method of manufacturing a semiconductor device, such as the semiconductor device shown in FIG. 3.

Referring to FIG. 5A, a semiconductor substrate 100 is provided having formed therein a first area 130, in which a first conductive MOS transistor is formed, and a second area 132, in which a second conductive MOS transistor having an opposite conduction type to the first conductive MOS transistor is formed.

A dielectric layer 102 having a high dielectric constant is formed on the semiconductor substrate 100 to have a thickness below about 50 Å. The dielectric layer 102 can be formed by a deposition process, such as an atomic layer deposition (ALD) process, for example.

In various embodiments, the dielectric layer 102 can include hafnium dioxide ($HfO_2$), zirconium dioxide ($ZrO_2$), titanium dioxide ($TiO_2$), tantalum oxide ($Ta_2O_5$), niobium oxide ($Nb_2O_3$), aluminum oxide ($Al_2O_3$), cerium oxide ($Ce_2O_3$), lanthanum oxide ($La_2O_3$), praseodymium oxide ($Pr_2O_3$), dysprosium oxide ($Dy_2O_3$), erbium oxide ($Er_2O_3$), yttrium oxide ($Y_2O_3$), zirconium silicate ($ZrSiO_4$), zirconium silicon oxynitride (ZrSiON), hafnium silicon oxynitride (HfSiON), hafnium aluminum oxide (HfAlO), hafnium aluminum oxynitride (HfAlON), aluminum silicon oxide (AlSiO), aluminum silicon oxynitride (AlSiON), barium silicate ($BaSiO_4$), lead silicate ($PbSiO_4$), barium strontium titanate (BST), lead zirconate titanate (PZT), and so on. These can be used alone or in combinations thereof.

A first metallic material is deposited on the dielectric layer 102 to form a first metallic conductive layer 103 on the dielectric layer 102. A thickness of the first metallic layer 103 is chosen such that a work function of the first and the second conductive MOS transistors is not influenced by the first metallic material.

In various embodiments, the first metallic conductive layer 103 includes tantalum nitride (TaN) and is formed by a chemical vapor deposition (CVD) process. The thickness of the first metallic conductive layer 103 can range from about 10 Å to about 50 Å.

In various embodiments, the first metallic conductive layer 103 is annealed by a rapid thermal treatment (RTP) process at a high temperature of not less than about 550° C. As a result, the first metallic conductive layer 103 is densified so that an etching rate of the first metallic conductive layer 103 is significantly reduced to be more than or equal to about ten percent of an etching rate of the first metallic conductive layer 103 before being annealed.

Figure 5B:
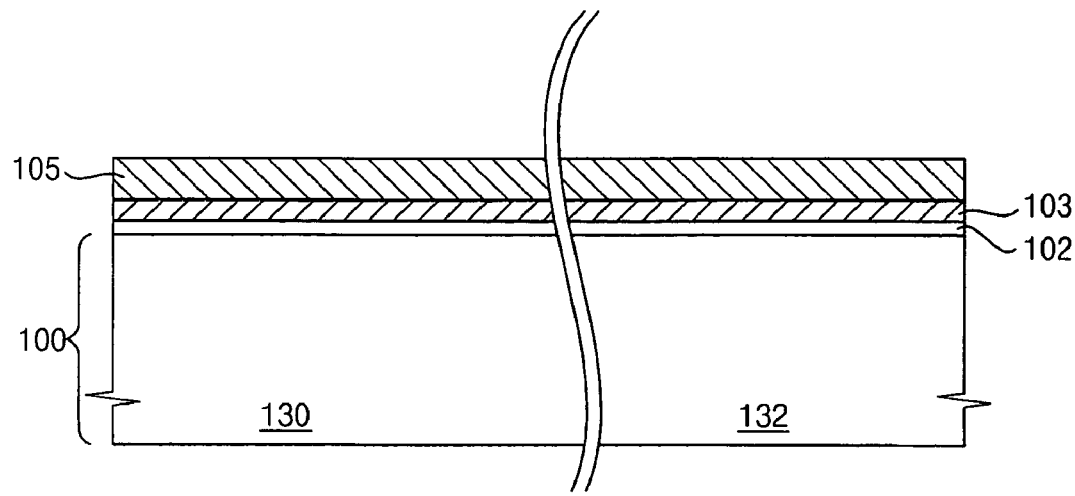

Referring to FIG. 5B, a second metallic material is deposited on the first metallic conductive layer 103 to form a second metallic conductive layer 105 on the first metallic conductive layer 103. The second metallic conductive layer 105 is thicker than the first metallic conductive layer 103, to provide a work function suitable for the first conductive MOS transistor.

When the second metallic material has a work function of about 4.8 eV to about 5.2 eV, the second metallic conductive layer 105 can be suitable for a PMOS transistor. Examples of the second metallic material suitable for the PMOS transistor include a metal such as iridium (Ir), nickel (Ni), palladium (Pd), platinum (Pt), beryllium (Be), tellurium (Te), rhenium (Re), ruthenium (Ru), rhodium (Rh), and a metal compound such as tantalum nitride (TaN), tungsten nitride (WN), ruthenium dioxide ($RuO_2$). These can be used alone or in combinations thereof.

Alternatively, when the second metallic material has a work function of about 4.0 to about 4.4 eV, the second metallic conductive layer 105 may be suitable for an NMOS transistor. Examples of the second metallic material suitable for the PMOS transistor include a metal such as hafnium (Hf), aluminum (Al), titanium (Ti), tantalum (Ta), niobium (Nb), molybdenum (Mo), and a metal compound such as tantalum nitride (TaN). These can also be used alone or in combinations thereof.

In an example embodiment, the second metallic conductive layer 105 can be formed to have a thickness of about 50 Å to about 150 Å by the CVD process, and can include tantalum nitride (TaN).

Figure 5C:
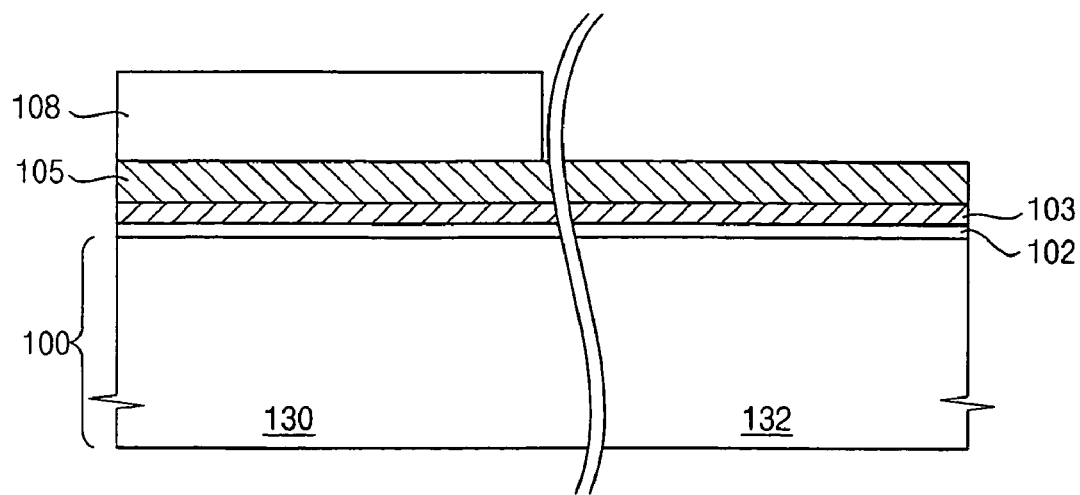

Referring to FIG. 5C, a silicon oxide layer (not shown) is formed on the second metallic conductive layer 105 as a hard mask layer. Then, a photosensitive (or photoresist) film (not shown) is formed on the hard mask layer, and is patterned by a photolithography process to thereby form a photosensitive pattern (not shown) through which the second area 132 of the substrate 100 is exposed. The hard mask layer is partially etched off using the photosensitive pattern as an etching mask, to thereby form a hard mask pattern 108 on the second metallic conductive layer 105 in the first area 130. That is, the second metallic conductive layer 105 in the first area 130 is covered with the hard mask pattern 108 and the second metallic conductive layer 105 in the second area 132 is exposed through the hard mask pattern 108. Subsequently, the photosensitive pattern can be removed from the hard mask pattern 108 by an ashing process and/or a stripping process, as examples.

Figure 5D:
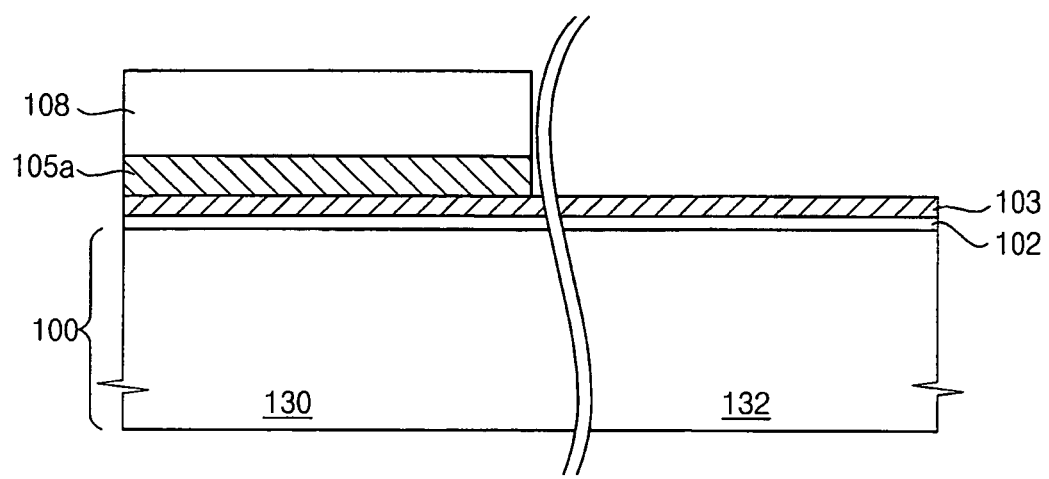

Referring to FIG. 5D, continuing with the illustrative embodiment, the second metallic conductive layer 105 is partially removed from the first metallic conductive layer 103 by a dry etching process using the hard mask pattern 108 as an etching mask. As a result, a second metallic conductive pattern 105a is formed on the first metallic conductive layer 103 from the second metallic conductive layer 105, but only in the first area 130 in which the first conductive MOS transistor is later to be formed.

In the above dry etching process of the second metallic conductive layer 105, the second metallic conductive layer 105 has an etching selectivity not less than about 10 with respect to the first metallic conductive layer 103, so that the dry etching process may be accurately terminated at substantially a top surface of the first metallic conductive layer 103. Therefore, because the first metallic conductive layer 103 covers the dielectric layer 102, the dielectric layer 102 is not exposed to an etching chemical and degradation of the dielectric characteristics of the dielectric layer 102 is substantially prevented.

Additionally, a thickness of the second metallic conductive layer 105 determining a work function required for the first conductive MOS transistor formed in the first area 130 and a thickness of the first metallic conductive layer 103 determining a work function of the second conductive MOS transistor formed in the second area 132 can be uniformly controlled.

As a modification to the above example embodiment, a plasma treatment may be further performed in a nitrogen atmosphere on the second metallic conductive layer 105. The plasma treatment may increase an etching rate of the second metallic conductive layer 105, so that the second metallic conductive layer 105 may have an etching selectivity of not less than about 20 with respect to the first metallic conductive layer 103.

Figure 5E:
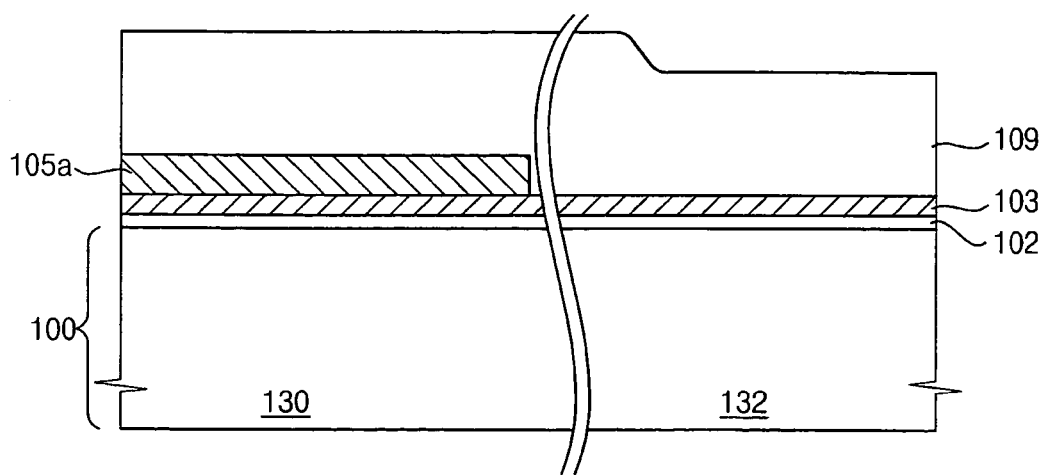

Referring to FIG. 5E, the hard mask pattern 108 is removed from the second metallic conductive pattern 105a by an etch back process, and a polysilicon layer 109 doped with N-type or P-type impurities is formed on the second metallic conductive pattern 105a and on the first metallic conductive layer 103 in the second area 132.

Subsequently, the polysilicon layer 109, the second metallic conductive pattern 105a and the first metallic conductive layer 103 are sequentially patterned by a photolithography process. Accordingly, the first gate structure 115, including the first metallic gate 110 and the polysilicon gate 112a, is formed in the first area 130 as a gate electrode for the first conductive type MOS transistor. The first metallic gate 110 has the lower metallic conductive pattern 104a formed as a portion of the first metallic conductive layer 103, and an upper metallic conductive pattern 106 formed as a portion of the second metallic conductive pattern 105a. The second gate structure 120 is formed in the second area 132 as a gate electrode for the second conductive type MOS transistor. The second gate structure 120 includes the second metallic gate 104b that is a portion of the first metallic conductive layer 103, and the second polysilicon gate 112b.

While the present example embodiment discloses that the first and the second metallic conductive layers 103 and 105 include substantially the same material, materials in the first and second metallic conductive layers 103 and 105 may also be different from each other, as would be known one of ordinary skill in the art. Although the first and the second metallic conductive layers 103 and 105 include substantially the same material, the second metallic conductive layer 105 may also be accurately etched off until a top surface of the first metallic conductive layer 103 is exposed for the annealing treatment. When the annealing treatment is performed on the first metallic conductive layer 103, an etching rate of the first metallic conductive layer 103 is significantly reduced in the dry etching process, below an etching rate of the second metallic conductive layer 105. As a result, the second metallic conductive layer 105 may also have a sufficient etching selectivity with respect to the first metallic conductive layer 103, so that only the second metallic conductive layer 105 is etched off during the dry etching process for a formation of the second metallic conductive pattern 105a.

Figure 6:
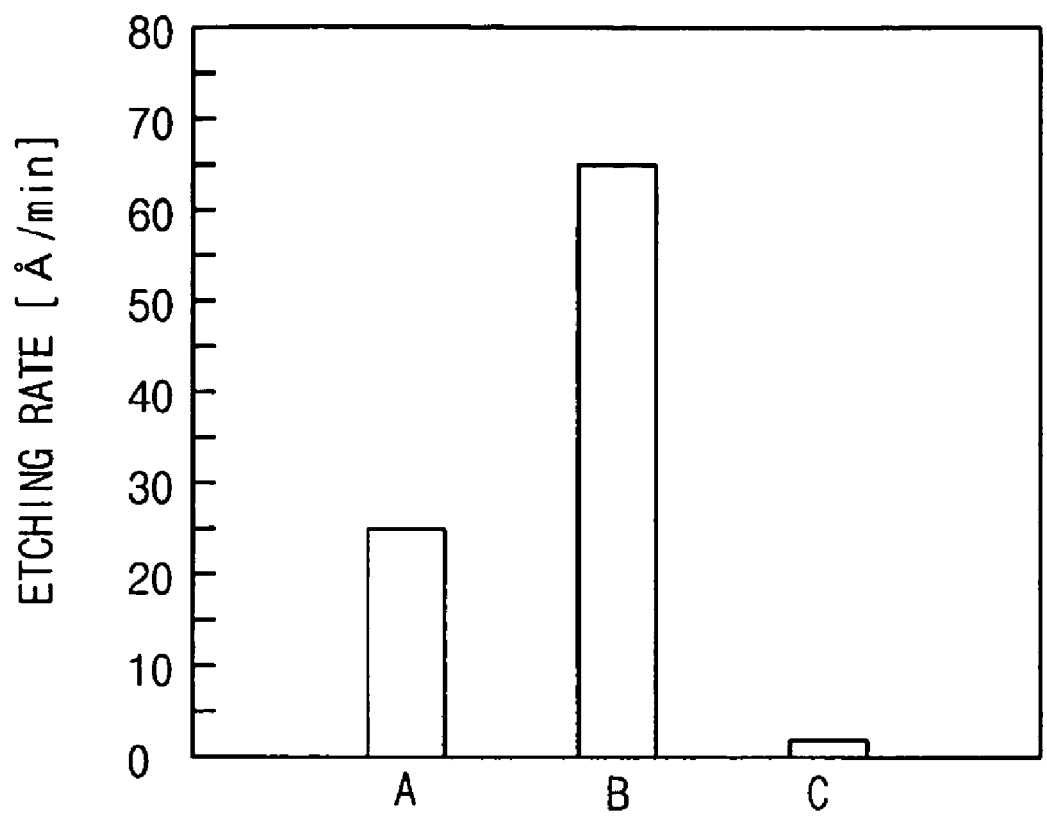
FIG. 6 is a graph showing an etching rate variation of a tantalum nitride layer according to process conditions.

FIG. 6 is a graph showing an etching rate of a tantalum nitride layer in accordance with process conditions of the tantalum nitride layer. In FIG. 6, a vertical line indicates an etching rate of the tantalum nitride layer and a horizontal line indicates a processing condition with respect to the tantalum nitride layer. The capital letter "A" denotes a pure tantalum nitride layer and the capital letter "B" denotes an annealed tantalum nitride layer formed from performance of an annealing treatment on the pure tantalum nitride layer. In addition, the capital letter "C" denotes a plasma tantalum nitride layer formed from performance of a plasma treatment on the pure tantalum nitride layer.

Referring to FIG. 6, the tantalum nitride layer has an etching rate of about 25 Å/min in an initial point of a deposition process. However, when the tantalum nitride layer is annealed at a high temperature above about 550° C., the tantalum nitride layer is densified so that the etching rate is reduced to about 2 Å/min, or below about ten percent of the etching rate before being annealed. Additionally, when the tantalum nitride layer undergoes a plasma treatment, the etching rate of the tantalum nitride layer increases to about 60 Å/min, or above about double of the etching rate of the tantalum nitride layer in the initial deposition.

Thus, when an etching rate of a first tantalum nitride is reduced by annealing the first tantalum nitride layer at a high temperature and then an etching process is performed on the second tantalum nitride layer, the second tantalum nitride layer has an etching selectivity of more than about 10 with respect to the first tantalum nitride layer, so that the etching process of the second tantalum nitride layer may be accurately terminated at the top surface of the first tantalum nitride layer.

Further, when the first tantalum nitride layer is annealed at a high temperature and then the second tantalum nitride layer undergoes the plasma treatment, the etching selectivity of the second tantalum nitride layer with respect to the first tantalum nitride has a value above about 1:20, so that the etching process may be more accurately terminated on the first tantalum nitride layer.

As described above, according to various embodiments of the present invention, the first metallic conductive layer is thinly formed on the gate dielectric layer, and the first metallic conductive layer is annealed to have a reduced etching rate. Subsequently, the second metallic conductive layer is more thickly formed on the first metallic conductive layer, and the remaining second metallic conductive layer formed in another area is removed. For example, the second metallic conductive layer formed in the second area is selectively removed, while the second metallic conductive layer remains in the first area. Hence, the first metallic gate including the first and the second metallic conductive layers is formed in the first area, and the second metallic gate including the first metallic conductive layer is formed in the second area.

In the etching process of the second metallic conductive layer, the first metallic conductive layer has a reduced etching rate so that the second metallic conductive layer may have the high etching selectivity with respect to the first metallic conductive layer. Thus, the etching process may be accurately terminated on the first metallic conductive layer.

Additionally, because the first metallic conductive layer covers the gate dielectric layer, the gate dielectric layer is not exposed to the etching chemical so that degradation of the dielectric characteristics of the gate dielectric layer can be prevented. Moreover, the thicknesses of the first and the second metallic gates may be controlled in the first and the second areas, respectively. Therefore, a gate electrode having an optimized work function for the NMOS transistor and the PMOS transistor, respectively, may be formed.

The foregoing illustrative embodiments are not to be construed as limiting of the present invention. Although a few example embodiments in accordance with the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses, if any, are intended to cover the structures described herein as performing the recited functions and structural and functional equivalents. Therefore, it is to be understood that the present invention is not to be construed as limited to the specific example embodiments disclosed herein, and that modifications to the disclosed exemplary embodiments, as well as other example embodiments, are intended to be included within the scope of the appended claims. The present invention is defined by the following claims, with equivalents of the claims to be included therein.

What is claimed is:

1. A method of manufacturing a semiconductor device having a dual gate structure, the method comprising:
   providing a semiconductor substrate having a first area and a second area;
   forming a dielectric layer on the semiconductor substrate;
   forming a first metallic conductive layer on the dielectric layer to a first thickness;
   annealing the first metallic conductive layer to reduce an etching rate of the first metallic conductive layer;
   forming a second metallic conductive layer on the annealed first metallic conductive layer to a second thickness greater than the first thickness, so that the second metallic conductive layer has an etching selectivity relative to the annealed first metallic conductive layer;
   as a function of the etching selectivity, etching the second metallic conductive layer from the annealed first metallic conductive layer in the second area of the substrate, while maintaining the second metallic conductive layer on the annealed first metallic conductive layer in the first area of the substrate;
   forming a first gate structure including a first metallic gate on the first area of the substrate and a second gate structure including a second metallic gate on the second area of the substrate, wherein the first metallic gate includes the annealed first metallic conductive layer and the second metallic conductive layer and the second metallic gate includes the annealed first metallic conductive layer.

2. The method of claim 1, wherein forming the first metallic conductive layer includes thinly forming the first metallic conductive layer to a thickness wherein a work function of each of the first and the second gate structures is primarily dependant upon a material formed on the first metallic conductive layer.

3. The method of claim 2, wherein the first thickness is in a range from about 10 Å to about 50 Å.

4. The method of claim 1, wherein the first metallic conductive layer is annealed at a temperature of not less than about 550° C.

5. The method of claim 1, wherein the first metallic conductive layer is annealed by a rapid thermal process (RTP).

6. The method of claim 1, wherein the second metallic conductive layer comprises a metallic material having a work function suitable for forming a metal-oxide semiconductor (MOS) transistor in the first area of the substrate.

7. The method of claim 1, wherein the second thickness is in a range from about 50 Å to about 150 Å.

8. The method of claim 1, wherein the first and the second metallic conductive layers comprise substantially the same material.

9. The method of claim 8, wherein the first metallic conductive layer and the second metallic conductive layer each comprise tantalum nitride (TaN).

10. The method of claim 1, wherein the first metallic conductive layer and the second metallic conductive layer are comprised of different materials.

11. The method of claim 1, further comprising increasing an etching rate and the etching selectivity of the second metallic conductive layer by performing a plasma treatment on the second metallic conductive layer prior to etching the second metallic conductive layer.

12. The method of claim 11, wherein the plasma treatment is performed in a nitrogen atmosphere.

13. A method of manufacturing a semiconductor device having a dual gate structure, the method comprising:
   providing a semiconductor substrate having a first area and a second area;
   forming a dielectric layer on the semiconductor substrate;
   forming a first metallic conductive layer on the dielectric layer to a first thickness;
   annealing the first metallic conductive layer to reduce an etching rate of the first metallic conductive layer;
   forming a second metallic conductive layer on the annealed first metallic conductive layer to a second thickness greater than the first thickness, so that the second metallic conductive layer has an etching selectivity relative to the annealed first metallic conductive layer;
   as a function of the etching selectivity, etching the second metallic conductive layer from the annealed first metallic conductive layer in the second area of the substrate, while maintaining the second metallic conductive layer on the annealed first metallic conductive layer in the first area of the substrate;
   forming a polysilicon layer on the second metallic conductive layer in the first area of the substrate and on the annealed first metallic conductive layer in the second area of the substrate; and
   forming a first gate structure in the first area and a second gate structure in the second area by partially etching the polysilicon layer, the second metallic conductive layer and the annealed first metallic conductive layer, including:
      forming the first gate structure to include a first metallic gate and a first polysilicon gate, wherein the first metallic gate includes a first metallic conductive pattern formed from the first metallic conductive layer and a second metallic conductive pattern formed from the second metallic conductive layer; and
      forming the second gate structure to include a second metallic gate and a second polysilicon gate, wherein the second metallic gate is formed from the first metallic conductive layer.

14. The method of claim 13, wherein forming the first metallic conductive layer includes thinly forming the first metallic conductive layer to a thickness wherein a work function of each of the first and the second gate structures is primarily dependant upon a material formed on the first metallic conductive layer.

15. The method of claim 13, wherein the first metallic conductive layer is annealed by a rapid thermal process (RTP).

16. The method of claim 13, wherein the second metallic conductive layer comprises a metallic material having a work function suitable for forming a MOS transistor in the first area of the substrate.

17. The method of claim 13, wherein the first metallic conductive layer and the second metallic conductive layer each comprise substantially the same material.

18. The method of claim 13, wherein the first metallic conductive layer and the second metallic conductive layer are comprised of different materials.

19. The method of claim 13, wherein etching the second metallic conductive layer includes:
   forming a mask layer on the second metallic conductive layer;
   partially etching the mask layer such that the mask layer is removed from the second metallic conductive layer in the second area of the substrate, while maintaining the mask layer on the second metallic conductive layer in the first area of the substrate, thereby forming a mask pattern through which the second metallic conductive layer in the second area of the substrate is exposed;
   removing the second metallic conductive layer in the second area of the substrate using the mask layer pattern as an etching mask, while maintaining the second metallic conductive layer in the first area of the substrate; and
   removing the mask layer pattern from the second metallic conductive layer remaining in the first area of the substrate.

20. The method of claim 19, further comprising increasing an etching rate and the etching selectivity of the second metallic conductive layer by performing a plasma treatment on the second metallic conductive layer prior to etching the second metallic conductive layer.

* * * * *